United States Patent
Simonov et al.

[11] Patent Number: 5,818,235
[45] Date of Patent: Oct. 6, 1998

[54] ELECTROSTATIC DISCHARGE TESTING

[75] Inventors: Alexander Simonov, Southfield; Andrew Zamm, Farmington Hills, both of Mich.

[73] Assignee: TRW Inc., Lyndhurst, Ohio

[21] Appl. No.: 738,968

[22] Filed: Oct. 24, 1996

[51] Int. Cl.[6] .......................... G01R 29/12; H01T 23/00
[52] U.S. Cl. .......................... 324/457; 361/230; 364/579
[58] Field of Search .................................. 324/452, 456, 324/457, 72.5, 754, 758, 761; 361/212, 220, 230, 231; 364/578, 579, 580

[56] References Cited

U.S. PATENT DOCUMENTS

| | | | |
|---|---|---|---|
| 3,590,372 | 6/1971 | DeSantis et al. | 324/72.5 |
| 4,742,427 | 5/1988 | Richman | 324/457 |
| 4,875,133 | 10/1989 | Kawamura | 324/457 |
| 4,926,285 | 5/1990 | Reinhardt et al. | 324/457 |
| 4,961,157 | 10/1990 | Nick et al. | 361/230 |
| 4,992,728 | 2/1991 | McCord et al. | 324/758 |
| 5,661,657 | 8/1997 | Jordan et al. | 324/72.5 |

OTHER PUBLICATIONS

A manual ESD test procedure described in SAE J1113 Standards published in Aug. 1987, including pp. 20.127–20.145 (noting, in particular, Section 5 Electrostatic Discharge at p. 20.132 and the relevant Figs. 9A and 9B at pp. 20.137 and 20.138).

*Primary Examiner*—Diep N. Do
*Attorney, Agent, or Firm*—Tarolli, Sundheim, Covell, Tummino & Szabo

[57] ABSTRACT

Apparatus and method are presented for supplying electrostatic discharges to a device under test. A discharge probe is employed for applying the discharges to the device. The probe is moved to preselected position points relative to the device during the test. The probe is displaced from one preselected position point to the next in response to position control signals supplied by a controller. The controller includes a memory for storing address data respecting the preselected position points.

19 Claims, 5 Drawing Sheets

ELECTROSTATIC DISCHARGE TESTING

THE FIELD OF THE INVENTION

The present invention relates to electrostatic discharge (ESD) testing and, more particularly, to improved testing apparatus and method.

DESCRIPTION OF THE PRIOR ART

The human body may be charged to a potential of several thousand volts as such a person moves across a carpet or the like. If a finger of the person approaches electronic equipment at a different potential, an electrostatic discharge will take place. This may occur during manufacturing or during subsequent use of the equipment in the field. The effects of ESD may be disruptive to the proper operation of such electronic equipment.

It is important to manufacturers of electronic equipment to understand the susceptibility of such equipment to damage from electrostatic discharge. ESD testing typically involves simulating a human finger approaching an electronic device under test (DUT). An ESD probe is manually displaced toward a DUT which has been placed on a metal table, connected to ground. The results of ESD testing can be of value to such manufacturers in improving such products so that they are less susceptible to such damage. Since all previously known ESD test setups have been based on manual testing at room ambient temperatures, it has been difficult to ensure test accuracy and repeatability. Numerous parameters have an impact on such ESD testing. These parameters include rate of applications of ESD (number of discharges per unit of time), speed at which the ESD probe approaches the test points, and the direction of motion of the ESD probe toward the test points.

A manual ESD test procedure is described in SAE J1113 Standards published in August 1987, including pages 20.127–20.145 (noting, in particular, Section 5 Electrostatic Discharge at page 20.132 and the relevant FIGS. 9A and 9B at pages 20.137 and 20.138). Additionally, U.S. Pat. No. 4,742,427 to Richman describes an electrostatic discharge simulation device. The SAE article and the Richman patent do not disclose controlling the positioning of a discharge probe as by a controller or a computer supplying position control signals. U.S. Pat. No. 4,961,157 to Nick et al., however, discloses a computer for use in controlling random time intervals between electrostatic charges and the duration of such a test.

SUMMARY OF THE INVENTION

In accordance with the invention, apparatus and method are provided for supplying electrostatic discharges to a device under test. A discharge probe is employed for applying the discharges to the device. The probe is moved to preselected position points relative to the device during the test. The probe is displaced from one preselected position point to the next in response to position control signals supplied by a controller.

In accordance with a more limited aspect of the present invention, the controller includes a memory for storing address data respecting the preselected position points.

Further, in accordance with the present invention, the velocity of the probe as it moves from one position point to the next is controlled by velocity control signals supplied by the controller.

BRIEF DESCRIPTION OF THE DRAWINGS

The foregoing and other objects of the invention will become more readily apparent from the following description of the preferred embodiment of the invention as taken in conjunction with the accompanying drawings which are a part hereof and wherein:

FIG. 4 which includes

DESCRIPTION OF PREFERRED EMBODIMENTS

Figure 1:
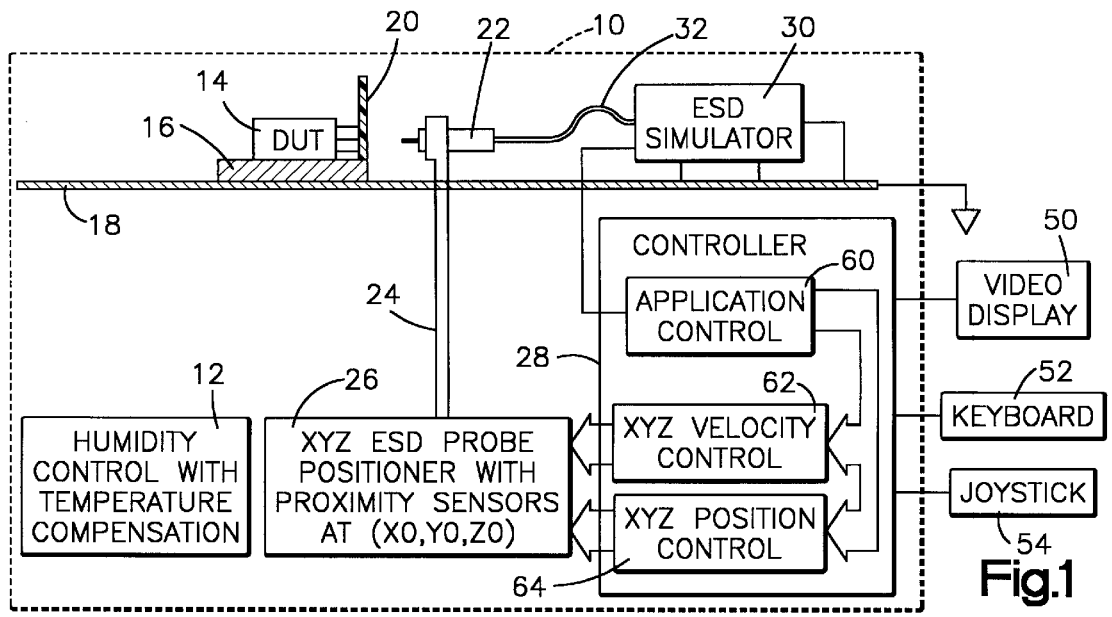
FIG. 1 is a schematic-block diagram illustration of a preferred embodiment of apparatus employed in the present invention.
Figure 2:
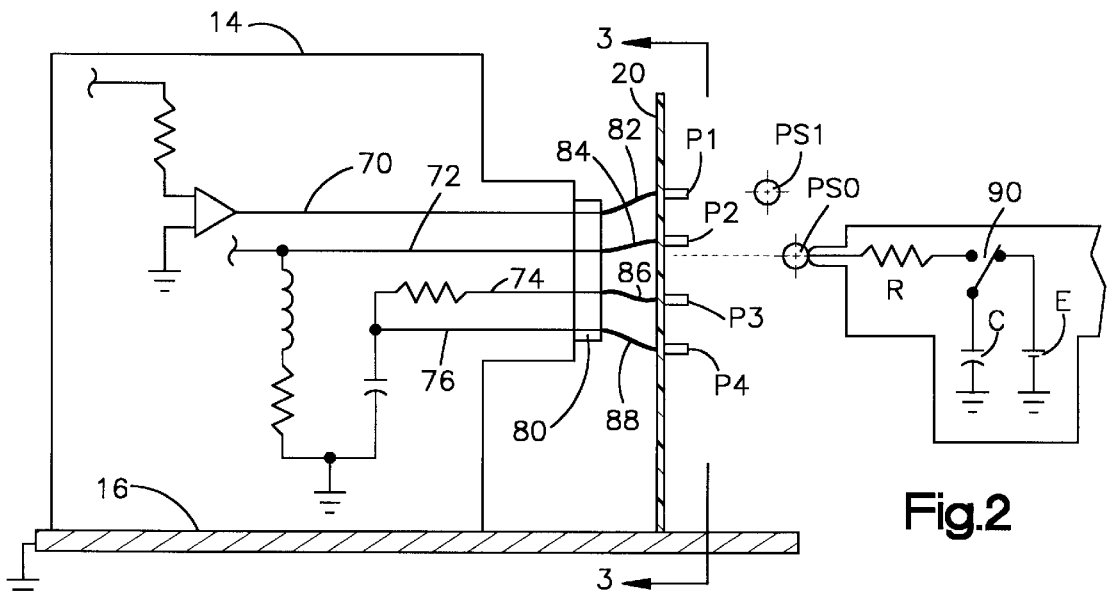
FIG. 2 is an enlarged schematic-block diagram illustration of the device under test and the ESD probe of FIG. 1.
Figure 3:
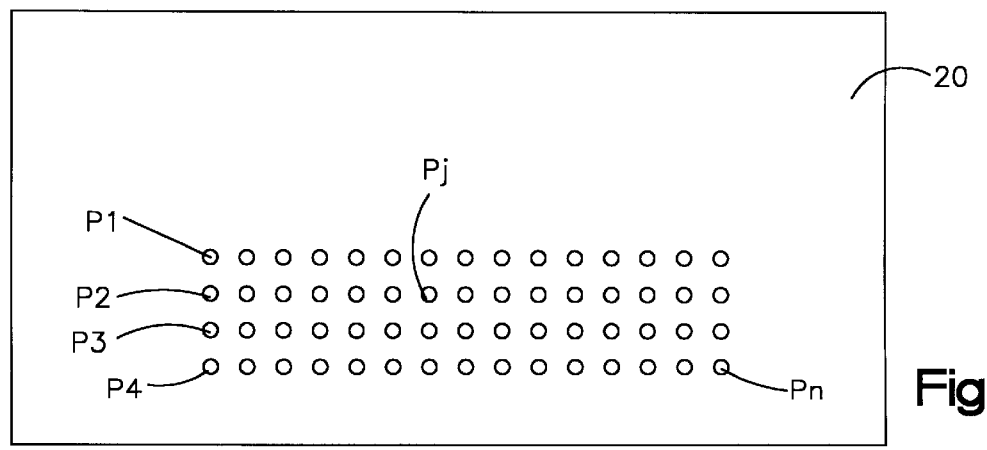
FIG. 3 is a view taken generally along lines 3—3 looking in the direction of the arrows in FIG. 2.

Reference is now made to the drawings wherein the showings are for purposes of illustrating a preferred embodiment of the invention only and not for the purpose of limiting same. Reference is initially made to FIGS. 1, 2 and 3 which illustrate the preferred embodiment of the ESD testing apparatus. The device under test (DUT) may take the form of electronic equipment such as a remote keyless entry receiver. Preferably, the testing takes place in a controlled environment such as within an enclosure 10 provided with suitable controls 12 for maintaining a desired level of humidity and temperature. In this way, repeated testing may take place at the same environmental conditions. The device under test (DUT) 14 is placed or mounted on a conductive plate 16 which, in turn, is suitably carried by a conductive table 18 connected to electrical ground. As will be described in greater detail with reference to FIGS. 2 and 3, the DUT 14 is provided with a plurality of conductors which extend through an insulator board 20. An ESD probe 22 is mounted on a post 24, which extends through a suitable aperture (not shown) in table 18. The probe is driven by a positioner 26 along three mutually perpendicular directions X, Y, Z under command of a computer based controller 28. Electrostatic discharges are provided by an ESD simulator generator 30 electrically connected to the probe 22 by means of a suitable cable 32. The probe 22 together with the ESD simulator generator 30 and the cable 32 may be obtained from KEYTEK Instrument Corporation as their series 2000 electrostatic discharge system.

The controller 28 includes suitable memory for storing data and program instructions and input-output circuitry for providing communications between the controller and suitable peripherals, including a video display 50, a keyboard 52 and a joystick 54. The memory includes an application control 60, an XYZ velocity control 62, and an XYZ position control 64. The memory stores XYZ position point address data and provides XYZ position signals to the probe positioner 26 for positioning the probe to the commanded position. Also, the memory stores velocity data and provides velocity control signals to the probe positioner for controlling the velocity of the probe as it is displaced from one position point to the next. This will all be discussed in greater detail hereinafter.

Reference is now made to FIGS. 2 and 3 which provide a more detailed illustration of the apparatus. The DUT 14 represents electronic equipment to be tested. This equipment is represented as including electronic circuitry having four input-output conductors 70, 72, 74, and 76 each extending from a circuit point to a connector 80. The connector includes breakout leads 82, 84, 86 and 88 that extend from the respective input-output conductors 70, 72, 74, and 76 through suitable apertures in an insulator board 20. The terminal ends of the breakout leads have insulation removed and the bare ends extend through the apertures of the board 20. The terminal ends of the leads are referred to herein as points P1, P2, P3, and P4.

The probe 22 is positioned to various preselected points in space relative to the DUT 14 during the testing process. In FIG. 2, a point in space PS1 is shown near point P1. Point PS1 is a point that was previously selected by the operator for the test.

The probe 22 is shown in FIG. 2 as being provided with circuitry that is a simplified version of that provided by the ESD simulator generator 30. This circuitry includes a resistor R which connects the probe tip to a single pole double throw switch 90. Switch 90 has a charge mode position, as shown, during which it connects a battery E to a capacitor C so that the capacitor is charged by the battery. The switch also has a discharge mode position during which a circuit is completed permitting the capacitor to discharge through the resistor and, thence, through space to the test point adjacent the probe tip. In this case, as the probe tip is moved to the point in space PS1, the switch is actuated by the controller 28.

Figure 4A:
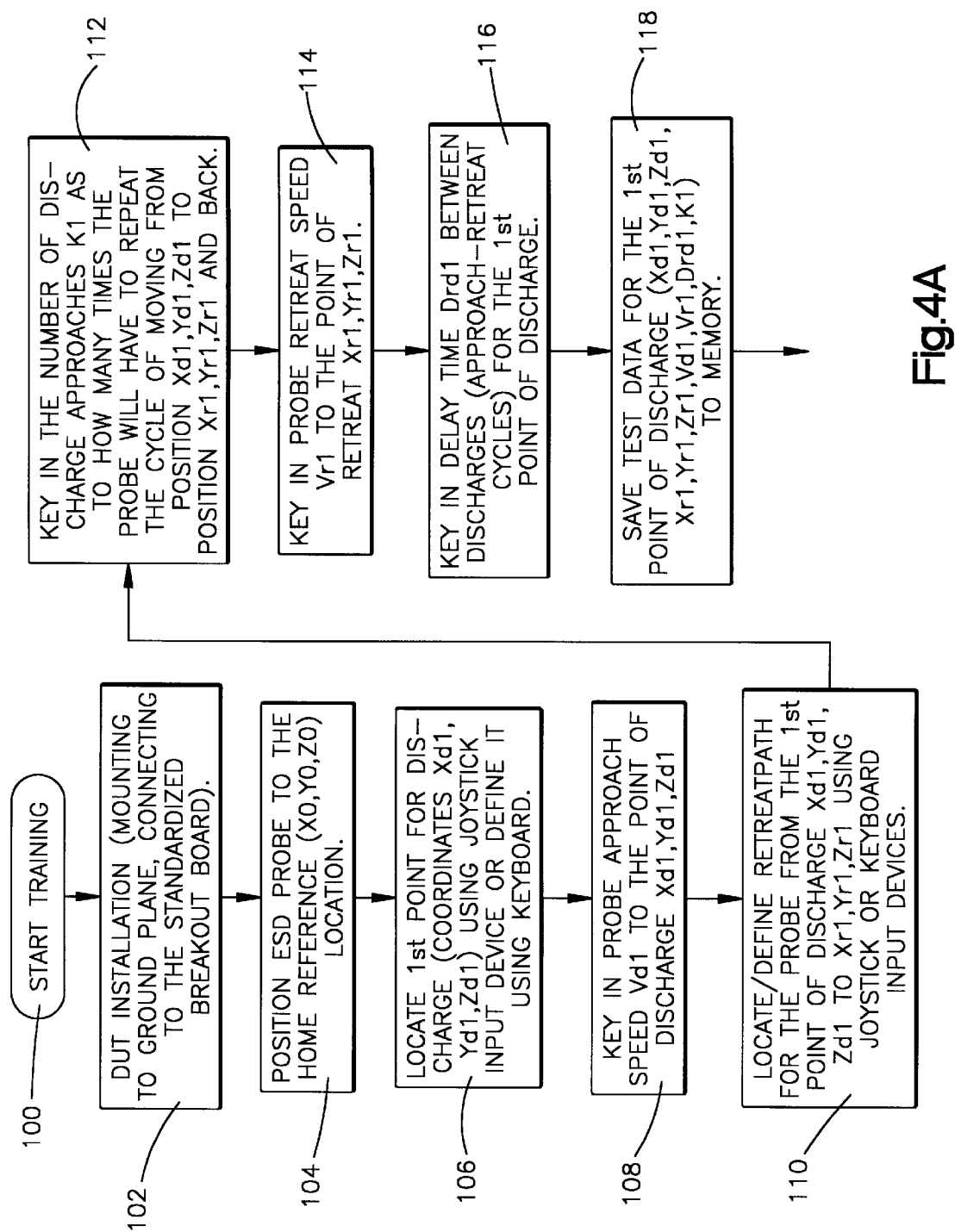
FIGS. 4A and 4B is a flow diagram illustrating a training procedure in accordance with the present invention; and, FIG. 5 which includes
Figure 4B:
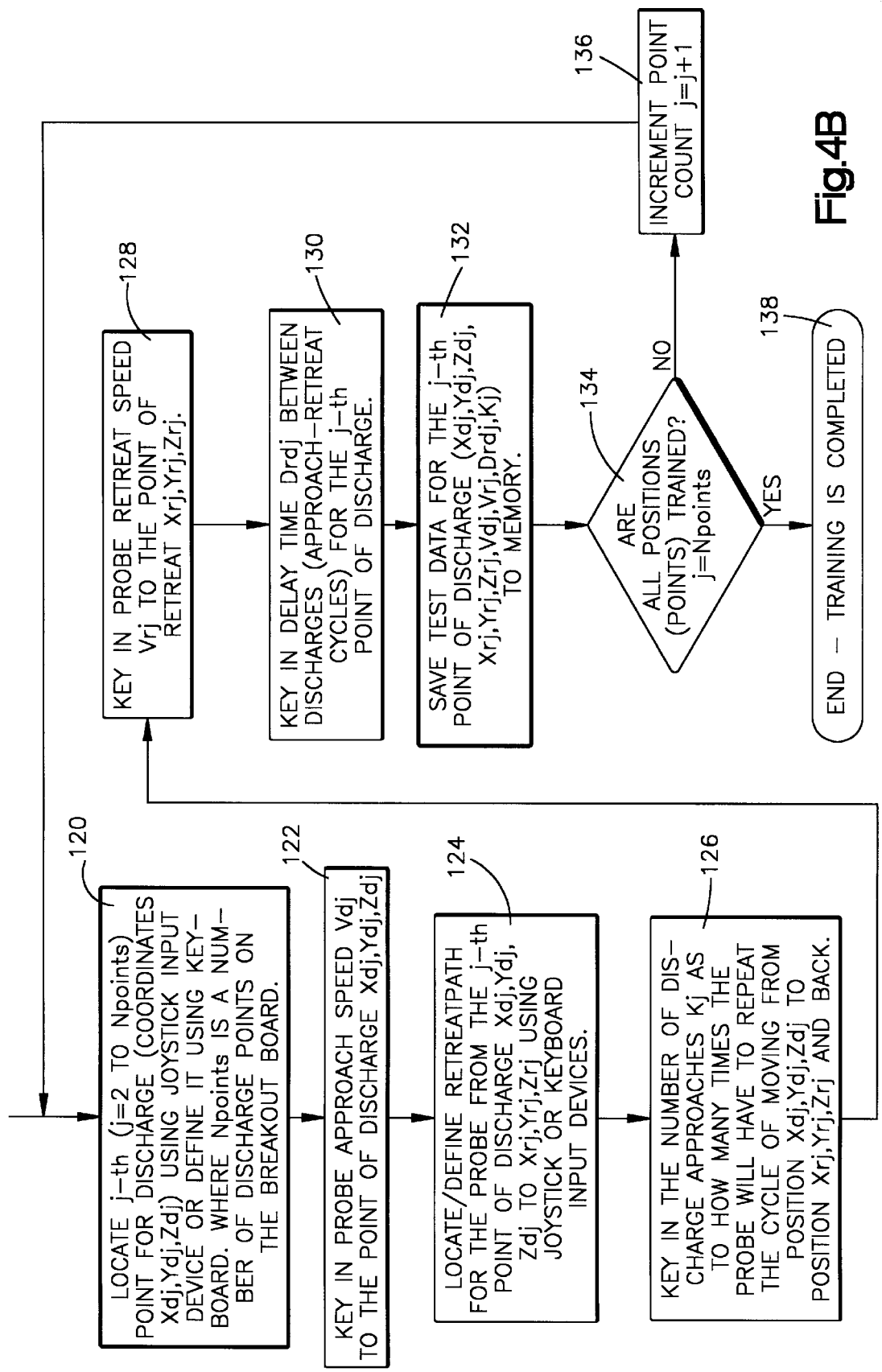

Reference is now made to FIG. 4 which illustrates the training procedure during which the operator positions the DUT 14 and then determines the preselected positions and velocity of the probe for a subsequent testing operation. The training commences at step 100 and advances to step 102 at which the operator installs the DUT 14 on plate 16 and employs the connector 80 to electrically connect the input-output conductors 70, 72, 74, and 76 to the breakout leads 82, 84, 86, and 88, respectfully. The bare ends of the breakout leads extend through suitable apertures in the breakout board at points P1, P2, P3, and P4. There are N apertures in the breakout board, permitting connections to N different points P1 through PN. For purposes of simplicity, only four input-output conductors leading to four circuit points of the circuitry within DUT 14 will be discussed herein.

With the DUT 14 properly installed, the procedure advances to step 104 during which the ESD probe 22 is positioned to a home reference location which may be defined by the coordinates X0, Y0, Z0. This is the point in space identified as point PSO in FIG. 2. The positioning of the probe may be accomplished by providing XYZ position control signals from the position control 64 to the probe positioner 26. These signals may be obtained by moving a conventional joystick 54 or by entering coordinate positions as with a keyboard 52. The probe will be in the home position X0, Y0, Z0 when suitable X, Y, Z proximity sensors, in the positioner 26, are all concurrently actuated.

In the steps that follow, the operator positions the probe to selected position points in space by displacing the probe from point to point. The position points include discharge points and retreat points. The probe is moved to a discharge point using the joystick input device or the keyboard to provide positioning signals. The operator then defines a retreat path for the probe to retreat from the first discharge point to a first retreat point, also using the joystick or keyboard. As the probe is displaced, the computer controller 28 keeps track of the coordinates of the various position points selected by the operator. The coordinates are viewed on the video display 50 and the operator may record the data as by entering it onto a note pad or, preferably, by entering into memory of the computer as by striking a suitable data entry key on the keyboard 52. Also, in conjunction with recording the position data, the operator will also record the desired probe velocity from one point to the next.

After the probe has been positioned to the home position, the procedure advances to step 106. During this step, the probe tip is positioned to the desired first discharge point PS1. This discharge point has coordinates Xd1, Yd1, Zd1. The coordinate data representing the discharge point is recorded by the operator.

In step 108, the operator enters the desired approach speed Vd1 from the home position to the first discharge point by recording it on a note pad or in computer memory.

In step 110, the operator defines the retreat path for the probe to retreat from the first discharge point Ps1 to the first retreat point Pr1, at coordinates Xr1, Yr1, Zr1, employing the keyboard 52 or the joystick 54. The coordinate data of this first retreat point Pr1 is recorded in memory.

In step 112, the operator records in memory the number of desired discharge approaches, K1, that are desired. The number of discharge approaches is equal to the number of times the probe repeats the cycle of moving from the first discharge position Ps1 to the first retreat position Pr1 and back.

In step 114, the operator records in memory the desired retreat speed Vr1 from the first discharge point Ps1 to the first retreat point Pr1.

In step 116, the operator records, in memory, the desired delay time Drd1 between discharges (approach-retreat cycles) for the first discharge point.

In step 118, the operator saves the data for the first discharge point that was recorded in memory.

The training procedure now advances to providing the data for the next point j at step 120 which corresponds with step 106 described above. This continues through steps 122, 124, 126, 128, 130, 132 which correspond with steps 108, 110, 112, 114, 116, and 118, respectfully. In step 134, a determination is made as to whether the training has been completed for all of the position points. If not, then point j is incremented by one so that j is equal to j+1 in step 136. Steps 120 through 132 are repeated until all of the desired position points have been trained, at which time N position points have been programmed. When all of the positions have been trained, this signifies the completion of the training at step 138.

Figure 5A:
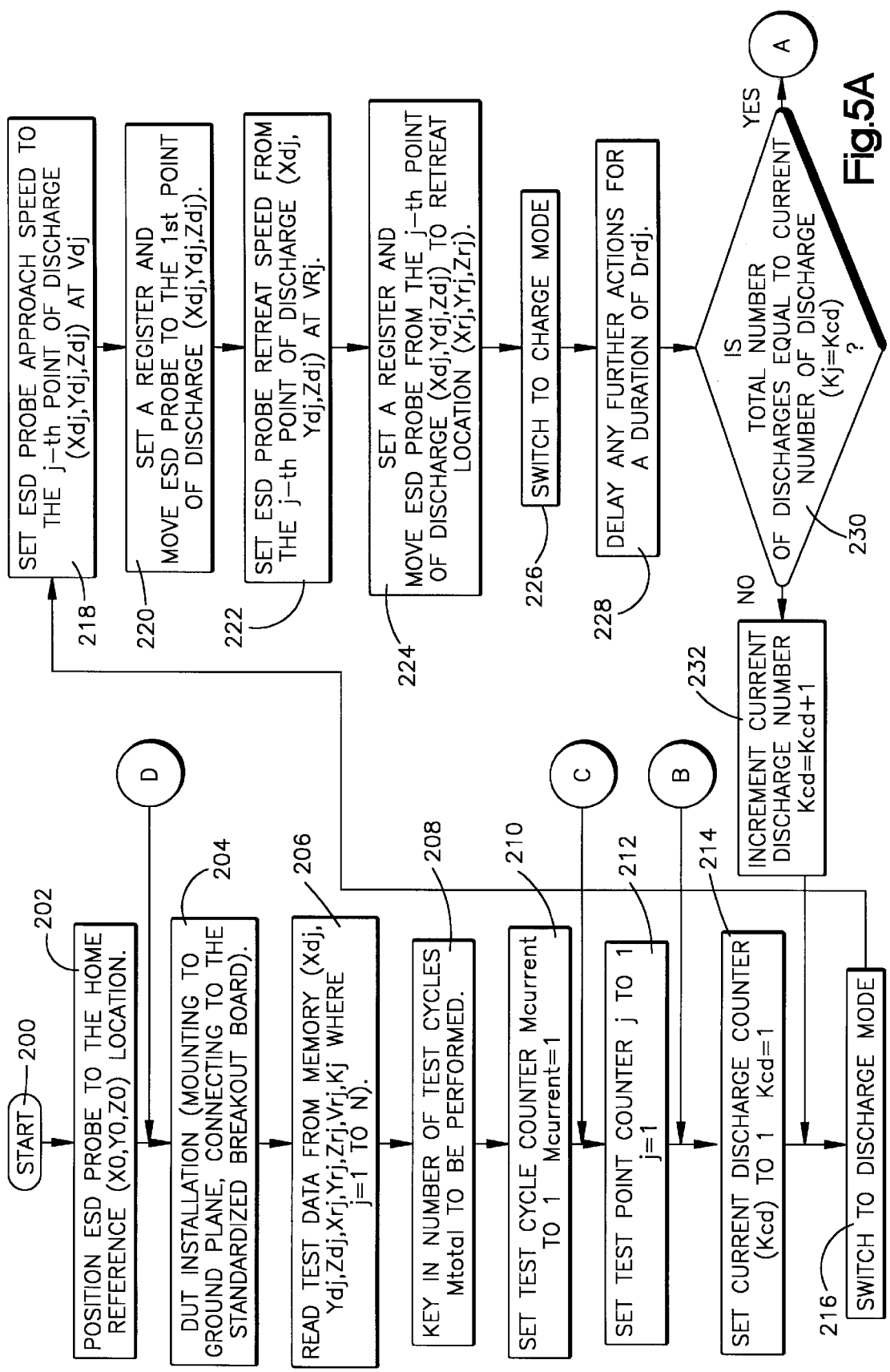
FIGS. 5A and 5B is a flow diagram illustrating the operation of the test procedure herein.
Figure 5B:
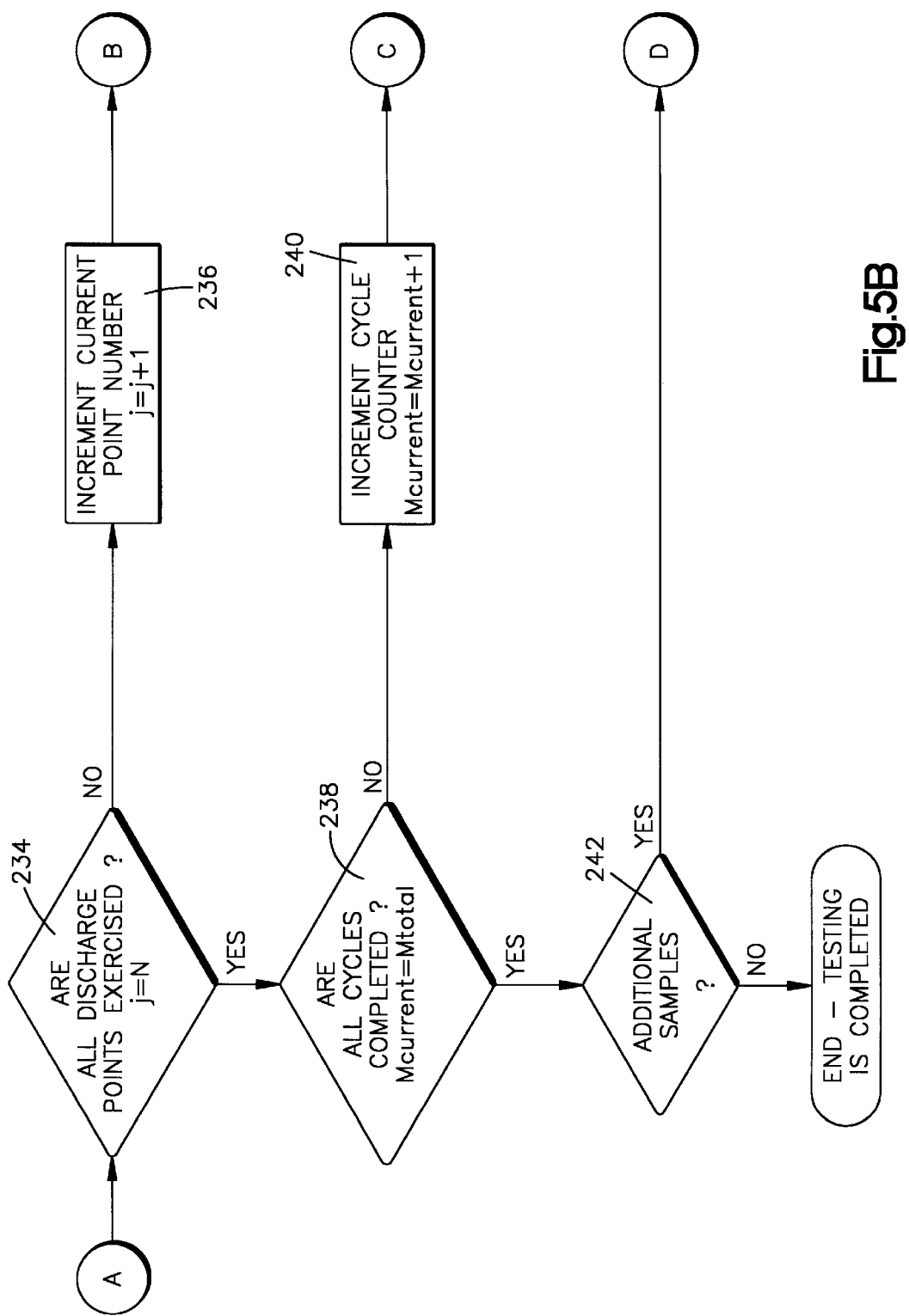

Reference is now made to FIG. 5 which is a flow chart illustrating the procedure in accordance with the present invention to achieve ESD testing. This procedure employs some manual steps as well as steps preferably performed by a programmed microcomputer employed as the controller 28. The procedure starts at step 200 and proceeds to step 202 at which the operator positions the ESD probe 22 to the home position at coordinates X0, Y0, Z0 in the manner described hereinbefore.

Thereafter, in accordance with step 204, the operator installs the DUT in the same manner as described above in step 102. In step 206, the test data is entered into memory in the microcomputer in the controller 28. The test data includes the data for each of the discharge points (Xdj, Ydj, Zdj), the retreat position points (Xrj, Yrj, Zrj), the approach speed to the discharge point (Vdj), the retreat speed back to the retreat position point (Vrj), the delay time (Drdj) between discharges, and the number of discharge approaches (Kj). In the foregoing, j=1 TO N. N=4 in the illustrated embodiment.

In step 208, the operator enters into the microcomputer, the number of test cycles Mtotal to be performed.

In step 210, a test cycle counter in the microcomputer is set, under program control, to a count of 1 (Mcurrent=1).

The procedure advances to step 212 at which a test point counter in the microcomputer is set to a count of 1 (j=1).

The procedure advances to step 214 during which the current discharge counter in the microcomputer (Kcd) is set to a count of 1 (Kcd=1).

The procedure advances to step 216 during which the microcomputer causes the switch 90 (FIG. 2) to switch to its discharge mode position so that the capacitor C will discharge as the probe advances to the next discharge point.

In accordance with step 218, the desired ESD approach speed Vdj to the j-th point of discharge (Xdj, Ydj, Zdj) is loaded into an appropriate register serving as velocity control 62. The register provides the velocity signal to the probe positioner 26.

The procedure advances to step 220 during which the address of the next discharge point (Xdj, Ydj, Zdj) is entered into a register serving as the position control 64 The controller is then triggered to move the probe to this discharge point at the velocity Vdj noted in step 218. At some point, during this movement, the capacitor C discharges through resistor R and, thence, from the tip of the probe and through the air gap and then into the appropriate breakout lead 82–88 and into the DUT (see FIG. 2).

The procedure advances to step 222 during which the probe retreat speed Vrj from the point of discharge back to the retreat point (Xrj, Yrj, Zrj) is entered into the XYZ velocity control 62.

The procedure then advances to step 224 during which the address of the retreat location (Xrj, Yrj, Zrj) is entered into the XYZ position control 64. The controller is then triggered to move the probe from the discharge point to this retreat location point at the retreat speed Vrj.

The procedure advances to step 226 during which the microcomputer controls switch 90 so as to be displaced to its charge mode position so that the capacitor C may be charged by battery E.

In step 228, the procedure is in delay mode for delay Drdj prior to the next discharge approach.

The procedure advances to step 230 during which a determination is made as to whether the current number of discharges is equal to the desired total number of discharges at point j. If not, the current discharge number Kcd is incremented in step 232 so that Kcd=Kcd+1 and the procedure repeats steps 216 through 230 until a determination is made that the current number of discharges is equal to the desired total number of discharges at point The procedure then advances to step 234 during which a determination is made as to whether all discharge points have been exercised (j=N). If not, the procedure advances to step 236.

During step 236, the test point counter is incremented so that j=j+1. Thereafter, the procedure repeats steps 214 through 234 until j is equal to N and then the procedure advances to step 238.

In step 238, a determination is made as to whether all cycles are completed. That is, is Mcurrent=Mtotal. If not, the procedure advances to step 240 during which the cycle counter is incremented so that Mcurrent=Mcurrent+1. Thereafter, the procedure repeats steps 212 through 238 until all cycles have been completed.

If all the cycles have been completed, the procedure advances to step 242 during which a determination is made by the operator as to whether all samples (DUTS) have been tested. If not, then as indicated by step 244, the testing is completed. If there are additional samples, then steps 204 through 242 are repeated until all samples have been tested.

From the above description of the invention, those skilled in the art will perceive improvements, changes and modifications. Such improvements, changes and modifications within the skill of the art are intended to be covered by the appended claims.

Having described the invention, we claim the following:

1. Apparatus for conducting a test by supplying electrostatic discharges to a device under test, comprising:

a discharge probe for use in applying said discharges;

means for moving said probe to a plurality of successive preselected position points spaced from and relative to said device under test during said test;

position control means responsive to position control signals representing said preselected position points for controlling the positioning of said probe; and, a controller for supplying said position control signals to said position control means for positioning said probe to said preselected points during said test.

2. An apparatus as set forth in claim 1 wherein said controller includes memory means for storing preselected address data respecting said preselected points.

3. An apparatus as set forth in claim 1 including velocity control means responsive to velocity control signals for controlling the velocity of said probe as it moves from one position point to the next; and said controller including means for supplying said velocity control signals to said velocity control means.

4. An apparatus as set forth in claim 3 wherein said controller includes memory means for storing preselected address data respecting said preselected points and velocity data respecting preselected probe velocity of said probe from one position point to the next.

5. An apparatus as set forth in claim 4 wherein said preselected position points include a plurality of discharge points each having an associated retreat point.

6. An apparatus as set forth in claim 5 wherein said address data includes data respecting said discharge points and said retreat points.

7. An apparatus as set forth in claim 6 wherein said velocity data includes data respecting preselected probe approach speed from one discharge point to the next discharge point.

8. An apparatus as set forth in claim 6 wherein said velocity data includes data respecting preselected retreat speed from one discharge point to an associated said retreat point.

9. An apparatus as set forth in claim 4 wherein said preselected position points include a plurality of discharge points each having an associated retreat point.

10. An apparatus as set forth in claim 9 wherein said address data includes data respecting said plurality of discharge points as well as the associated said retreat points.

11. An apparatus as set forth in claim 10 wherein said velocity data includes data respecting the preselected approach speed from one of said discharge points to the next.

12. An apparatus as set forth in claim 11 wherein said velocity data includes data respecting the preselected retreat speed from each of said discharge points to the associated one of said retreat points.

13. A method of conducting a test by supplying electrostatic discharges to a device under test comprising the steps of:

moving an electrostatic discharge probe to a plurality of successive preselected position points being spaced from and relative to said device under test;

providing a plurality of position control signals representing said preselected position points; and, controlling the movement of said probe in accordance with said position control signals.

14. A method as set forth in claim 13 including the step of providing velocity control signals representative of desired probe velocity from one position point to the next.

15. A method as set forth in claim 14 including controlling the velocity of said probe from one position point to the next in accordance with said velocity signals.

16. A method as set forth in claim 13 wherein said preselected position points include a plurality of discharge points each having an associated retreat point.

17. A method as set forth in claim 16 including the step of providing address data respecting said plurality of discharge points and the associated said retreat points.

18. A method as set forth in claim 17 including the step of providing velocity data respecting preselected approach speeds from one discharge point to the next.

19. A method as set forth in claim 18 wherein said velocity data includes data respecting preselected retreat speeds from said plurality of discharge points to each associated said retreat point.

* * * * *